United States Patent
Ikeda

(10) Patent No.: US 10,443,130 B2
(45) Date of Patent: *Oct. 15, 2019

(54) PLASMA PROCESSING APPARATUS WITH SHOWER PLATE HAVING PROTRUSION FOR SUPPRESSING FILM FORMATION IN GAS HOLES OF SHOWER PLATE

(71) Applicant: TOKYO ELECTRON LIMITED, Tokyo (JP)

(72) Inventor: Taro Ikeda, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 341 days.

This patent is subject to a terminal disclaimer.

(21) Appl. No.: 14/968,346

(22) Filed: Dec. 14, 2015

(65) Prior Publication Data
US 2016/0177448 A1 Jun. 23, 2016

(30) Foreign Application Priority Data
Dec. 18, 2014 (JP) .................................. 2014-256294

(51) Int. Cl.
*C23C 16/511* (2006.01)
*C23C 16/455* (2006.01)
(Continued)

(52) U.S. Cl.
CPC ...... *C23C 16/511* (2013.01); *C23C 16/45563* (2013.01); *C23C 16/45565* (2013.01);
(Continued)

(58) Field of Classification Search
CPC .................... C23C 16/45565; C23C 16/45574
(Continued)

(56) References Cited

U.S. PATENT DOCUMENTS 5,647,945 A * 7/1997 Matsuse .................... C23C 8/06
156/345.38
5,996,528 A * 12/1999 Berrian ............. C23C 16/45565
118/723 E (Continued)

FOREIGN PATENT DOCUMENTS

JP 2003-188103 A 7/2003
JP 2005-196994 A 7/2005
(Continued)

OTHER PUBLICATIONS

International search report dated Dec. 9, 2014 for corresponding International application No. PCT/JP2014/073311.

*Primary Examiner* — Karl Kurple
(74) *Attorney, Agent, or Firm* — Nath, Goldberg & Meyer; Jerald L. Meyer

(57) ABSTRACT

There is provided a plasma processing apparatus which includes a plasma generating antenna equipped with a shower plate and configured to supply a first gas and a second gas into a processing vessel. The apparatus includes a drooping member installed to protrude downward from a lower end surface of the shower plate. An outer surface of the drooping member spreads outward as it goes from a top end to a bottom end thereof. The shower plate includes a plurality of first and second gas supply holes through which the first and second gases are supplied into the processing vessel, respectively. Each of the first gas supply holes is disposed inward of the outer surface of the drooping member. Each of the second gas supply holes is disposed outward of the outer surface of the drooping member. An orifice portion is formed in the through-hole.

5 Claims, 12 Drawing Sheets

(51) Int. Cl.
*C23C 16/517* (2006.01)
*H01J 37/22* (2006.01)
*H01J 37/32* (2006.01)

(52) U.S. Cl.
CPC ...... *C23C 16/45578* (2013.01); *C23C 16/517* (2013.01); *H01J 37/222* (2013.01); *H01J 37/3244* (2013.01); *H01J 37/32192* (2013.01); *H01J 37/32229* (2013.01); *H01J 37/32449* (2013.01)

(58) Field of Classification Search
USPC .................................... 156/345.33, 345.34
See application file for complete search history.

(56) References Cited

U.S. PATENT DOCUMENTS

| | | | |
|---|---|---|---|
| 6,576,062 B2* | 6/2003 | Matsuse | C23C 16/45519 118/719 |
| 7,552,521 B2* | 6/2009 | Fink | H01J 37/32623 29/557 |
| 8,092,598 B2* | 1/2012 | Baek | C23C 16/4412 118/715 |
| 8,303,713 B2* | 11/2012 | Belousov | C23C 16/45574 118/715 |
| 8,882,913 B2* | 11/2014 | Byun | C23C 16/40 118/715 |
| 9,080,237 B2* | 7/2015 | Behres | C23C 16/301 |
| 9,484,191 B2* | 11/2016 | Winkler | H01J 37/32449 |
| 9,552,966 B2* | 1/2017 | Komatsu | H05H 1/46 |
| 9,589,770 B2* | 3/2017 | Winkler | H01J 37/32357 |
| 9,657,845 B2* | 5/2017 | Shugrue | C23C 16/45544 |
| 2002/0123200 A1 | 9/2002 | Yamamoto | H01J 37/32192 438/345 |
| 2002/0148566 A1* | 10/2002 | Kitano | H01L 21/67069 156/345.51 |
| 2003/0178143 A1* | 9/2003 | Perrin | H01J 37/32192 156/345.41 |
| 2004/0094094 A1* | 5/2004 | Ohmi | H01J 37/32192 118/723 MW |
| 2004/0149699 A1 | 8/2004 | Hofman et al. | |
| 2005/0272247 A1* | 12/2005 | Ikeda | H01L 21/28556 438/618 |
| 2006/0005929 A1* | 1/2006 | Ishii | H01J 37/32192 156/345.49 |
| 2006/0137613 A1* | 6/2006 | Kasai | H01J 37/32192 118/723 MW |
| 2006/0228496 A1* | 10/2006 | Choi | H01J 37/3244 427/569 |
| 2007/0068625 A1* | 3/2007 | Funk | C23C 16/4412 156/345.29 |
| 2007/0163996 A1* | 7/2007 | Horiguchi | H01J 37/32192 216/67 |
| 2008/0185104 A1* | 8/2008 | Brcka | H01J 37/32357 156/345.29 |
| 2008/0303744 A1* | 12/2008 | Hirayama | B08B 7/00 343/900 |
| 2009/0169744 A1* | 7/2009 | Byun | C23C 16/40 427/255.28 |
| 2009/0229754 A1* | 9/2009 | Iizuka | C23C 16/4412 156/345.34 |
| 2009/0242130 A1* | 10/2009 | Tian | H01J 37/32192 156/345.41 |
| 2010/0055319 A1 | 3/2010 | Kato et al. | |
| 2011/0203735 A1* | 8/2011 | Seo | H01J 37/3244 156/345.34 |
| 2013/0137273 A1* | 5/2013 | Engelhardt | H01L 21/67069 438/710 |
| 2013/0256268 A1* | 10/2013 | Chen | H01J 37/32504 216/67 |
| 2014/0283747 A1* | 9/2014 | Kasai | C23C 16/4401 118/723 R |
| 2015/0214013 A1 | 7/2015 | Glukhoy | |
| 2016/0222516 A1* | 8/2016 | Ikeda | C23C 16/511 |

FOREIGN PATENT DOCUMENTS

| | | |
|---|---|---|
| KR | 1020070091589 A | 9/2007 |
| KR | 1020130081369 A | 7/2013 |
| KR | 1020140115978 A | 10/2014 |
| TW | 200537561 A | 11/2005 |

* cited by examiner

PLASMA PROCESSING APPARATUS WITH SHOWER PLATE HAVING PROTRUSION FOR SUPPRESSING FILM FORMATION IN GAS HOLES OF SHOWER PLATE

CROSS-REFERENCE TO RELATED APPLICATION

This application claims the benefit of Japanese Patent Application No. 2014-256294, filed on Dec. 18, 2014, in the Japan Patent Office, the disclosure of which is incorporated herein in its entirety by reference.

TECHNICAL FIELD

The present disclosure relates to a plasma processing apparatus including a shower plate for supplying a predetermined gas into a processing vessel.

BACKGROUND

A plasma process is a technique indispensable to the manufacture of semiconductor devices. In recent years, further miniaturization of semiconductor devices constituting LSI has been required to meet demand for high-integration and high-speed of LSI.

To do this, recently, there has been proposed a microwave plasma processing apparatus which is capable of generating plasma with a low electron temperature and a high plasma density, as compared with a capacitively coupled plasma processing apparatus or an inductivity coupled plasma processing apparatus used in a conventional plasma process.

There is known a plasma processing apparatus which generates a surface wave plasma having a high plasma density at a low electron temperature within a processing vessel by transmitting a microwave through a coaxial tube to radiate the same into the processing vessel and exciting a plasma generation gas using an electric field energy of a surface wave of the microwave.

However, such a plasma processing apparatus has a structure in which, in order to irradiate the processing vessel with the microwave through the coaxial tube, a ceiling portion of the processing vessel is configured such that a quartz dielectric plate is inserted between the surface wave plasma and an antenna, and a processing gas is supplied into the processing vessel through a sidewall of the processing vessel. In this way, since the gas is supplied from a portion other than the ceiling portion, the flow of the gas cannot be controlled. This fails to achieve good plasma control.

To address this, there is proposed a technique which installs a shower plate on a bottom surface of an antenna, and introduces a processing gas into a processing vessel along a path directed vertically downward from the shower plate. The shower plate is formed of a dielectric. The processing gas is supplied through a plurality of gas supply holes penetrating through the shower plate in its thickness direction. A leading end portion of the gas supply hole has a narrow orifice shape to prevent reverse diffusion of the gas from the inside of the processing vessel to the gas supply hole. This arrangement forms a vertical gas stream inside the processing vessel and uniformly supplies the processing gas, thereby forming uniform plasma.

However, for example, in the plasma processing apparatus including the antenna and the shower plate, an electron temperature of plasma in a region in the vicinity of the shower plate is higher than an electron temperature in a position spaced apart from a surface of the shower plate due to the surface wave plasma. As such, in a film formation process, a raw material gas, such as a monosilane gas ($SiH_4$), is excessively decomposed in the vicinity of the shower plate so that a film of the decomposed gas is deposited in the shower plate. This may clog the leading end of the gas supply hole having an orifice shape. Such a clogging causes a deviation in the flow of the processing gas inside the processing vessel.

In order to prevent excessive decomposition of the raw material gas, the output of the microwave supplied to the antenna is required to be decreased. However, the decrease of the output of the microwave insufficiently excites the plasma generation gas. This fails to stably form plasma. Also, in terms of productivity, it is required to efficiently excite the plasma generation gas and improve a film forming rate in a film formation process, for example.

Under these circumstances, the present inventors have found that, to prevent the excessive decomposition of the raw material gas requires installing a drooping portion in the bottom surface of the shower plate, the drooping portion being formed to protrude downward while spreading outward as it goes from the top end to the bottom end thereof, supplying the raw material gas such as a monosilane gas into the processing vessel through gas supply holes formed in the drooping portion, and supplying the plasma generation gas outward of an outer surface of the drooping portion. By doing so, the raw material gas does not pass through a region in which the electron temperature of the surface of the shower plate is high so that the excessive decomposition of the raw material is prevented. Since the outer surface of the drooping portion spreads outward as it goes from the top end toward the bottom end thereof, the microwave is reflected in a lateral direction or an upwardly inclined direction from the outer surface of the drooping portion. As a result, it is considered that the electric field intensity in the vicinity of the outer surface of the drooping portion is increased, so that the plasma generation gas can be efficiently excited to thereby generate plasma in addition, the present inventors have actually performed a confirmation test using the shower plate equipped with the drooping portion. The test shows that it is possible to prevent the excessive decomposition of the raw material gas and to appropriately excite the plasma generation gas.

However, it was confirmed that an orifice portion of the gas supply hole was still clogged even when the shower plate equipped with the drooping portion is used. As a result obtained by inspecting a material that lead to the clogging, it was confirmed that the material was a product derived from the raw material gas or the plasma generation gas, which is called as $SiH_x$ or $Si_xN_y$. The reason for this may be that the electron temperature is increased in the vicinity of the orifice portion of the gas supply hole by the microwave surface wave on the surface of the shower plate, and $SiH_2$ or Si is generated as electrons collide with the monosilane gas in the vicinity of the orifice portion, or SiN is generated as radicals of the plasma generation gas such as nitrogen gas collide with the monosilane gas. Thus, it is required to control the electron temperature in the vicinity of the orifice portion of the gas supply hole or suppress the generation of the product.

SUMMARY

Some embodiments of the present disclosure provide a plasma processing apparatus which includes a shower plate configured to introduce a gas into a processing vessel and generates a surface wave plasma using a microwave, thus suppressing a product from being deposited in a gas supply hole of the shower plate and efficiently generating plasma.

According to one embodiment of the present disclosure, there is provided a plasma processing apparatus that processes a substrate by generating plasma using a surface wave formed on a surface of a shower plate by a supplied microwave, the plasma processing apparatus including a plasma generating antenna which is equipped with the shower plate configured to supply a first gas and a second gas into a processing vessel, which including: a drooping member made of a conductor and installed to protrude downward from a lower end surface of the shower plate, wherein an outer surface of the drooping member spreads outward as it goes from a top end to a bottom end thereof, wherein the shower plate includes a plurality of first gas supply holes through which the first gas is supplied into the processing vessel and a plurality of second gas supply holes through which the second gas is supplied into the processing vessel, wherein an upwardly-depressed concave portion is formed in a lower end surface of the drooping member, wherein a through-hole in communication with the concave portion from an upper end surface of the drooping member is formed inside the drooping member, wherein each of the first gas supply holes is disposed inward of the outer surface of the drooping member and is connected to the through-hole, wherein each of the second gas supply holes is disposed outward of the outer surface of the drooping member, wherein an orifice portion having a smaller sectional area than the through-hole is formed in the through-hole, and wherein a potential of the drooping member is a ground potential.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
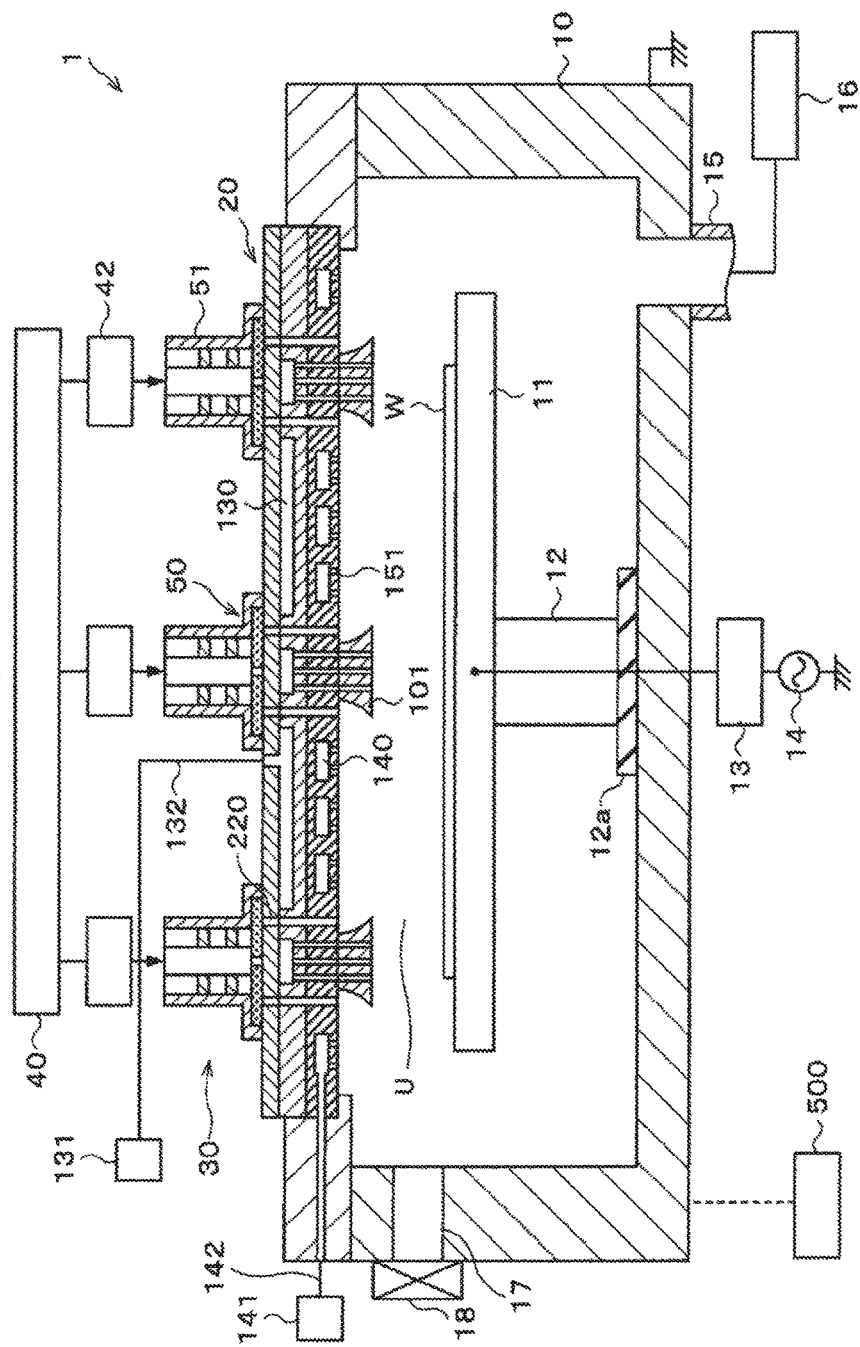
FIG. 1 is a longitudinal sectional view schematically showing a configuration of a plasma processing apparatus according to an embodiment of the present disclosure.

Reference will now be made in detail to various embodiments, examples of which are illustrated in the accompanying drawings. In the specification and drawings, like reference numerals will be assigned to like parts having substantially the same functions and duplicate descriptions thereof will be omitted. Further, in the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

First, the entire configuration of a plasma processing apparatus according to an embodiment of the present disclosure will be described with reference to FIG. 1. FIG. 1 is a longitudinal sectional view schematically showing a plasma processing apparatus 1.

In this embodiment, a CVD apparatus which performs a film formation process as a plasma process on a semiconductor wafer W (hereinafter, referred to as a "wafer W") will be described as an example of the plasma processing apparatus 1. The plasma processing apparatus 1 includes an internally-sealable processing vessel 10 configured to perform the plasma process on the wafer W. The processing vessel 10 has a substantially cylindrical shape having an opened top face and is formed of for example, a metal such as aluminum. The processing vessel 10 is grounded.

A susceptor 11 for mounting the wafer W thereon is installed at a lower portion of the processing vessel 10. The susceptor 11 is installed at the lower portion of the processing vessel 10 while being supported by a supporting member 12 through an insulator 12a. With this configuration, the susceptor 11 is electrically insulated from the processing vessel 10. An example of a material of the susceptor 11 and the supporting member 12 may include aluminum whose surface is alumite-treated (anodized).

The susceptor 11 is connected to a bias high-frequency power source 14 through a matcher 13. The high-frequency power source 14 applies a bias high-frequency power to the susceptor 11. Thus, ions in plasma are drawn into the wafer W. In addition, although not shown, an electrostatic chuck for electrostatically sucking the wafer W, a temperature control mechanism, a gas flow path through which a gas for heat radiation is supplied to a rear surface of the wafer W, lift pins configured to lift up and down to transfer the wafer W, and the like may be installed in the susceptor 11.

An exhaust port 15 is installed in the bottom portion of the processing vessel 10. The exhaust port 15 is connected to an exhaust device 16 equipped with a vacuum pump. The exhaust device 16 is operated to exhaust the inside of the processing vessel 10, thus decompressing the inside of the processing vessel 10 to a predetermined level of vacuum. Also, a loading/unloading port 17 is formed in a sidewall of the processing vessel 10. The wafer W is loaded into and unloaded from the processing vessel 10 with an operation of a gate valve 18 configured to open and close the loading/unloading port 17.

A plasma generating antenna 20 (hereinafter, simply referred to as an "antenna 20") configured to supply microwaves while supplying a gas into the processing vessel 10 is muffled above the susceptor 11. The antenna 20 is installed to block an upper opening of the processing vessel 10. This forms a plasma space U defined between the susceptor 11 and the antenna 20. A microwave transmitting mechanism 30 for transmitting microwaves therethrough is connected to a top portion of the antenna 20 such that the microwaves output from a microwave output part 40 are transmitted to the antenna 20.

Figure 2:
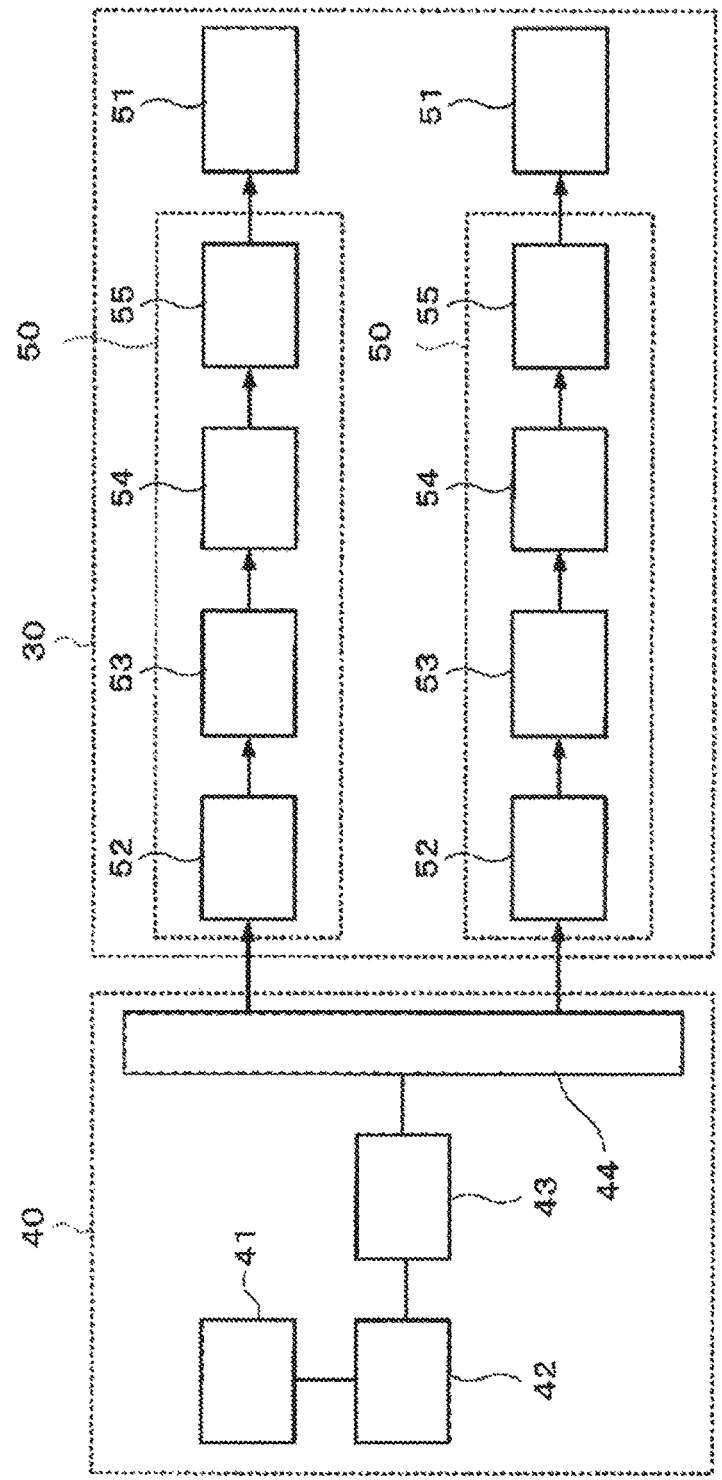
FIG. 2 is a view showing an output-side mechanism of a microwave.

For example, as shown in FIG. 2, the microwave output part 40 includes a microwave power source 41, a microwave oscillator 42, an amplifier 43, and a divider 44 configured to divide amplified microwaves into a plurality of microwaves. The microwave power source 41 supplies power to the microwave oscillator 42. The microwave oscillator 42 oscillates the microwaves having a predetermined frequency of, e.g., 860 MHz, in a phase-locked loop (PLL). The amplifier 43 amplifies the oscillated microwaves. The divider 44 divides the microwaves amplified by the amplifier 43 while performing an impedance matching between input and output sides to prevent loss of the microwaves if possible.

Figure 3:
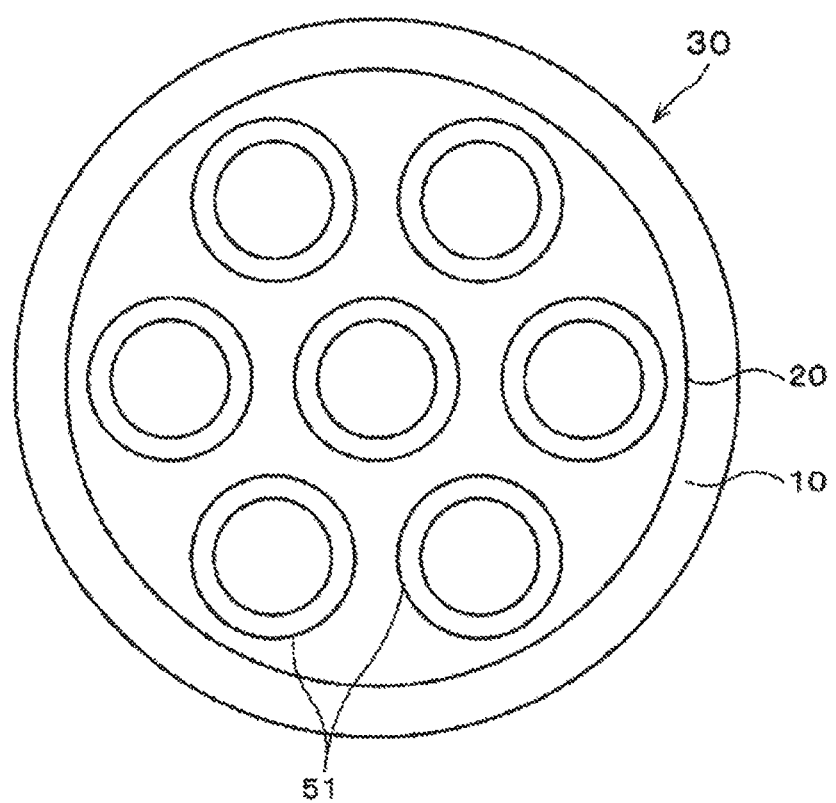
FIG. 3 is a plan view schematically showing a configuration of a microwave transmitting mechanism.

The microwave transmitting mechanism 30 includes a plurality of antenna modules 50 and a plurality of microwave introduction mechanisms 51, which induce the microwaves divided by the divider 44 into the processing vessel 10. In FIG. 2, the microwave transmitting mechanism 30 is schematically shown to include two antenna modules 50 and two microwave introduction mechanisms 51. However, in this embodiment, for example, as shown in FIG. 3, the microwave transmitting mechanism 30 includes, for example, seven antenna modules 50, wherein six antenna modules 50 are arranged in the same circumferential direction and one antenna module 50 at the center thereof are disposed on the top portion of the antenna 20.

The antenna module 50 includes a phase shifter 52, a variable gain amplifier 53, a main amplifier 54, and an isolator 55 and transmits the microwaves outputted from the microwave output part 40 to the microwave introduction mechanism 51.

The phase shifter 52 is configured to shift and adjust the phase of the microwave, thereby modulating radiation characteristics of the microwave. With this configuration, it is possible to change a plasma distribution by controlling the directivity of the microwave. When the modulation of the radiation characteristics is not required, the phase shifter 52 may be omitted.

The variable gain amplifier 53 adjusts a power level of the microwave to be inputted into the main amplifier 54 so as to adjust a plasma intensity. The main amplifier 54 constitutes a solid state amplifier. The solid state amplifier may include an input matching circuit, a semiconductor amplifying element, an output matching circuit, and a high Q resonant circuit, which are not shown.

The isolator 55 is configured to isolate a reflective wave of the microwave which reflects from the antenna 20 and then returns to the main amplifier 54, and includes a circulator and a dummy load (coaxial terminator). The circulator introduces the microwave reflecting from the antenna 20 into the dummy load. The dummy load converts the reflective wave of the microwave introduced by the circulator into heat.

Figure 4:
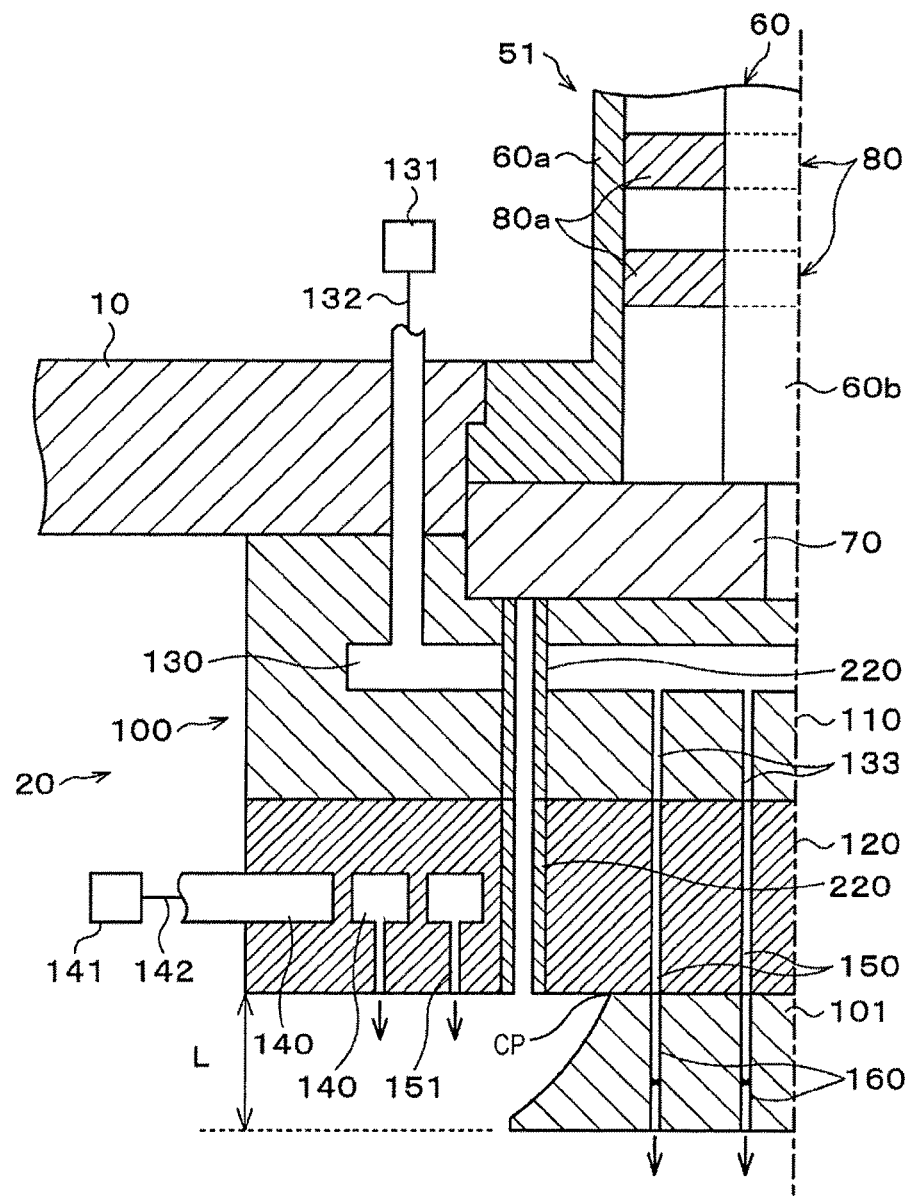
FIG. 4 is an enlarged longitudinal sectional view schematically showing a configuration in the vicinity of a microwave introduction mechanism.

Next, configurations of the microwave introduction mechanism 51 and the plasma generating antenna 20 will be described with reference to FIG. 4. FIG. 4 is an enlarged longitudinal sectional view schematically showing, for example, a left-half configuration of the microwave introduction mechanism 51 and the antenna 20 according to this embodiment.

The microwave introduction mechanism 51 includes a coaxial tube 60 and a slow-wave plate 70. The coaxial tube 60 includes a coaxial waveguide which is constructed of a cylindrical outer conductor 60a and a rod-shaped inner conductor 60b installed in the center of the outer conductor 60a. The antenna 20 is installed at a lower end of the coaxial tube 60 through the slow-wave plate 70. In the coaxial tube 60, the inner conductor 60b is configured as a power supply side, and the outer conductor 60a is configured as a ground side. Tuners 80 are installed in the coaxial tube 60. The tuners 80 include, for example, two slugs 80a, and constitutes a slug tuner. Each of the slugs 80a is configured as a plate body of a dielectric member and is formed in a circular ring shape between the inner conductor 60b and the outer conductor 60a of the coaxial tube 60. Based on instructions provided from a control part 500 (which will be described later), the tuner 80 is configured to vertically move the slugs 80a with a operation of a driving mechanism (not shown) and adjust impedance of the coaxial tube 60.

The slow-wave plate 70 is installed adjacent to a bottom surface of the coaxial tube 60. The slow-wave plate 70 is formed of a dielectric member having a circular plate shape. The slow-wave plate 70 transmits the microwaves passing through the coaxial tube 60 and guides the same to the antenna 20.

The antenna 20 includes a shower plate 100. The shower plate 100 is installed adjacent to a bottom surface of the slow-wave plate 70. The shower plate 100 has an approximately disc-shaped having a larger diameter than that of the slow-wave plate 70 and is formed of a conductor having high electrical conductivity, such as aluminum or copper. A bottom surface of the shower plate 100 is exposed to the plasma space U of the processing vessel 10. A surface wave propagates through the exposed bottom surface. Here, a metal bottom surface of the shower plate 100 is exposed to the plasma space U. Hereinafter, the surface wave propagated through the exposed bottom surface will be referred to as a metal surface wave.

Drooping members 101 protruding downward, i.e., toward the plasma space U, are respectively installed at positions corresponding to the bottom surface of the shower plate 100 below the coaxial tube 60. Each of the drooping members 101 has an approximately truncated conical shape with a circular bottom. Like the shower plate 100, the drooping member 101 is formed of a conductor having high electrical conductivity, such as aluminum or copper. Thus, like the processing vessel 10, the potential of the drooping member 101 is a ground potential. An outer surface of the drooping member 101 is formed in, e.g., a shape gradually spreading outward as it goes from the top end to the bottom end thereof. That is to say, the outer surface of the drooping member 101 has a parabolic shape in which a contact point (CP) of the shower plate 100 and the outer surface of the drooping member 101 is set as the origin (a vertex of the parabolic shape).

The shower plate 100 has a structure in which an approximately disc-shaped upper plate 110 is vertically overlapped with an approximately disc-shaped lower plate 120. The upper plate 110 includes a gas flow path 130 formed to penetrate through the top surface thereof and through which a gas flows in a diameter direction of the upper plate 110. The gas flow path 130 is coupled to a first gas supply source 131 configured to supply a first gas through a supply pipe 132. The first gas may include plural kinds of gases or be a mixed gas thereof. The first gas may be, for example, monosilane gas ($SiH_4$) as a raw material gas.

A plurality of first gas supply holes 133 in communication with the gas flow path 130 is formed to extend vertically upward at positions in the lower portion of the upper plate 110 and inward of the outer surface of the drooping member 101. A plurality of slots 220 used as radiation holes through which microwaves pass is formed at positions different from those of the first gas supply holes 133. In some embodiments, the shape of each of the drooping members 101 and the arrangement of each of the slots 220 may be set such that an imaginary line drawn vertically downward from the center of the slot 220 intersects the outer surface of the drooping member 101. In other words, as viewed from the top, each of the slots 220 may be arranged such that the center thereof is positioned inward of an outer circumferential end of the bottom surface of the drooping member 101.

Through-holes 150 vertically penetrating through the lower plate 120 are formed at positions corresponding to the first gas supply holes 133 in the lower plate 120, respectively. With such a configuration, the first gases passing through the first gas supply holes 133 can reach a lower end surface of the lower plate 120 through the through-holes 150, respectively. Like the upper plate 110, slots 220 are respectively formed at positions corresponding to the slots 220 of the upper plate 110 in the lower plate 120.

Figure 5:
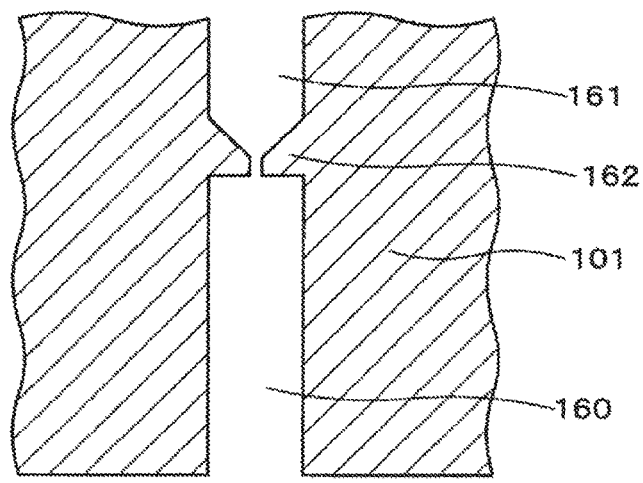
FIG. 5 is an enlarged longitudinal sectional view schematically showing a configuration in the vicinity of an orifice portion of a drooping member.

As shown in FIG. 5, concave portions 160 depressed upwardly are formed at positions corresponding to the lower ends of the through-holes 150 in the drooping member 101, respectively. Each of the concave portions 160 is formed in an approximately circular cylindrical shape having, e.g., a radius of about 1 to 2 mm and a height of about 7 to 10 mm. A method of setting the shape of the concave portion 160 will be described later. Through-holes 161 extending from an upper end surface of the drooping member 101 to communicate with the concave portions 160 are formed at positions corresponding to the lower ends of the through-holes 150 in the drooping member 101, respectively. An orifice portion 162 having an opening, the diameter of which is smaller than that of the through-hole 161 or the concave portion 160, is formed between the through-hole 161 and the concave portion 160. In other words, the sectional area of the orifice portion 162 is set to be smaller than that of the through-hole 161 or the concave portion 160. In this embodiment, the diameter of the opening of the orifice portion 162 is set to approximately 0.3 mm, but is not limited thereto. The diameter of the opening of the orifice portion 162 may be arbitrarily set as long as a pressure difference can be ensured to the extent that a gas is not reversely diffused through the through-hole 161 from the plasma space in the processing vessel 10.

The drooping member 101, as shown in FIG. 4, is provided to protrude vertically downward by a predetermined length L from the lower end of the shower plate 120. Thus, the first gas supplied to the gas flow path 130 from the first gas supply source 131 is introduced into the plasma space U of the processing vessel 10 from positions spaced apart by the predetermined length L from the lower plate 120, through the plurality of through-holes 161.

A gas flow path 140 which is formed to penetrate through a lateral surface of the lower plate 120 and through which a gas flows in the diameter direction of the lower plate 120, is formed in the lower plate 120. The gas flow path 14 is coupled to a second gas supply source 141 configured to supply a second gas through a supply pipe 142. An example of the second gas may include a nitrogen gas, an argon gas, a hydrogen gas, a mixed gas thereof or the like as a plasma generation gas. The gas flow path 140 is provided completely independently of the gas flow path 130 such that the second gas flowing through the gas flow path 140 and the first gas flowing through the gas flow path 130 are not mixed in the shower plate 100.

A plurality of second gas supply holes 151 in communication with the gas flow path 140 is formed to extend vertically upward at positions which are spaced further apart from the outer surface of the drooping member 101 and different from those of the slots 220 in the lower portion of the lower plate 120. The second gas supplied to the gas flow path 140 from the second gas supply source 141 is introduced into the plasma space U of the processing vessel 10 from the lower surface of the lower plate 120 through each of the second gas supply holes 151. While in FIG. 4, the shower plate 100 includes the upper plate 110 and the lower plate 120, and the gas flow path 130 for the first gas and the gas flow path 140 for the second gas are formed independently of each other, the configuration of the shower plate 100 is not limited to this embodiment. The configuration of the shower plate 100 may be arbitrarily set as long as the first and second gases are not mixed in the shower plate 100.

The plurality of slots 220 described above are formed to penetrate through the shower plate 100 in the thickness direction at positions different from those of the gas flow paths 130 and 140 used as the gas supply paths, the plurality of first gas supply holes 133, the plurality of second gas supply holes 151, and the through-holes 150 and 161. One end of the slot 220 is adjacent to the slow-wave plate 70, and the other end of the slot 220 is opened toward the plasma space U of the processing vessel 10. The microwave is radiated into the processing vessel 10 by propagating through the coaxial tube 60, followed by transmitting through the slow-wave plate 70, followed by passing through the plurality of slots 220. In some embodiments, the slat 220 may have a structure in which the inside of the slot 220 is filled with a dielectric such as quartz.

The diameter of the second gas supply hole 151 is sized so that the microwave radiated into the processing vessel 10 is not introduced into the second gas supply hole 151. In this embodiment, the diameter of the second gas supply hole 151 is, for example, 0.6 mm. Also, the slots 220 are completely separated from the first gas supply holes 133, the second ins supply holes 151, and the through-holes 150 and 161 inside the shower plate 100. With this configuration, it is possible to prevent abnormal discharge from generating in the first gas supply holes 133, the second gas supply hole 151, or the through-holes 150 and 161.

Contact surfaces between the slow-wave plate 70, the upper plate 110 and the lower plate 120 are sealed by O rings (not shown), respectively. With this configuration, it is possible to make the inside of the processing vessel 10 or the slots 220 in a vacuum state, as well as to prevent the first and second gases from being mixed in the shower plate 100.

In some embodiments, a surface exposed to plasma in the shower plate 100, i.e., the lower end surface of the lower plate 120 and a surface of the drooping member 101 may be coated with, for example, a film (not shown) of alumina ($Al_2O_3$) or yttria ($Y_2O_3$) through a thermal spraying. In this way, a conductive surface may not be exposed to the plasma space.

Figure 6:
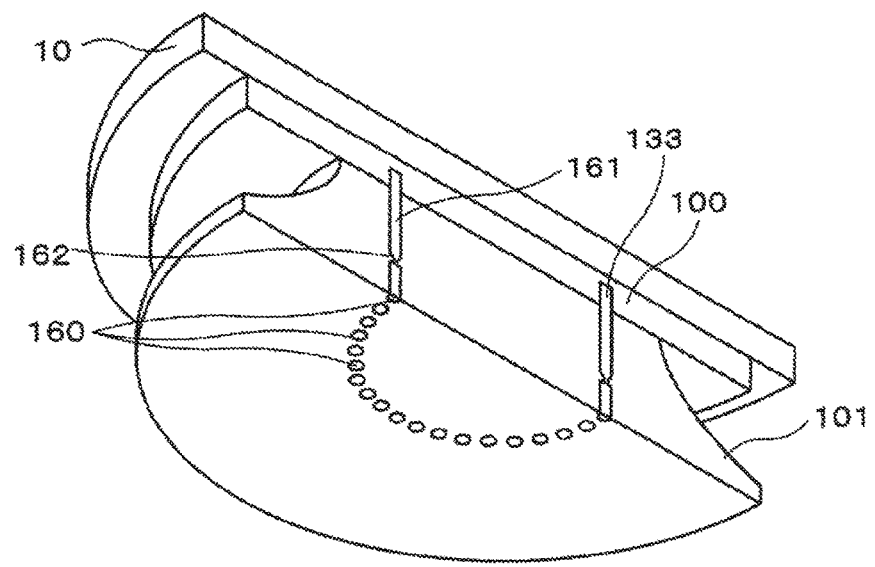
FIG. 6 is a perspective view showing a sectional shape in the vicinity of the drooping member.

FIG. 6 shows an example of a schematic positional relationship between the shower plate 100, the drooping member 101, the lower plate 120, the first gas supply holes 133, and the through-holes 161 and the concave portions 160 formed in the drooping member 101 and is a perspective view of a cross section in the vicinity of the drooping member 101 when obliquely viewed from below. For example, as shown in FIG. 6, the concave portions 160 and the through-holes 161 formed in the drooping member 101 are concentrically arranged with the drooping member 101 in the vicinity of a central portion of the drooping member 101. In FIG. 6, the concave portions 160, the through-holes 161 and the first gas supply holes 133 are shown to be formed only in one concentric circle, while omitting the through-holes 150. In addition, as described above, the first gas supply holes 133 are formed at positions corresponding to the through-holes 161, respectively. Therefore, in this embodiment, the first gas supply holes 133 are also concentrically arranged with the drooping member 101 as shown in, e.g., FIG. 6.

Next, a configuration in the vicinity of the shower plate 100 and the drooping member 101 will be described based on the principle of the present disclosure. In a microwave-based plasma process, energy of about 8.75 eV or more is required to decompose, for example, monosilane ($SiH_4$), which is used as a raw material gas when forming a film on the wafer W, into $SiH_3$. Meanwhile, for example, nitrogen gas used as a plasma generation ins has a binding energy of about 9.91 eV. That is to say, energy of about 9.91 eV or more is necessarily applied to generate a nitrogen plasma or nitrogen radicals by exciting the nitrogen gas. Thus, an output of the microwave supplied to the antenna 20 in the microwave-based plasma process is determined based on higher energy, i.e., energy for exciting the plasma generation gas. Here, in a microwave plasma process using a metal surface wave (particularly, a surface wave-based plasma process using an evanescent wave), an electron temperature in the vicinity of a lower end surface of the antenna 20, for example, a region spaced apart by about 5 mm or less from a bottom surface of the antenna 20 generally is increased as compared with a region spaced apart by about 5 mm or more from the bottom surface of the antenna 20.

Figure 7:
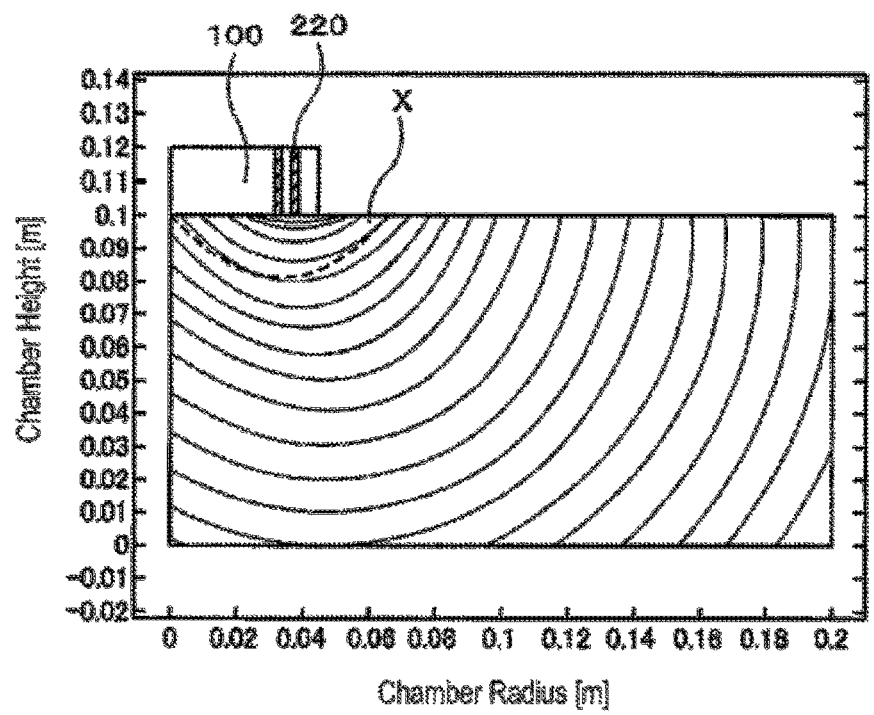
FIG. 7 is an explanation view showing an electron temperature distribution in the vicinity of a conventional shower plate.

The present inventors have performed an examination and have found that the electron temperature was particularly increased in the vicinity of the slot 220 formed in the shower plate 100. FIG. 7 shows an electron temperature distribution in the vicinity of the shower plate 100 having the slot 220 formed at an outer circumferential portion thereof. In FIG. 7, a vertical axis represents a height in the processing vessel 10, and a horizontal axis represents a distance in the horizontal direction from the center axis of the coaxial tube 60. In FIG. 7, there is illustrated the electron temperature distribution when the center of the slot 220 is set to be spaced apart by about 35 mm from the center axis of the coaxial tube 60. Also, a dashed line shown in FIG. 7 is a boundary line where the electron temperature is 1 eV. In FIG. 7, the electron temperature in a region X near to the slot 220 from the dashed line (a region spaced apart by a radius of about 35 mm from the slot 220) is higher than 1 eV, and a region in the vicinity of the slot 220 becomes a region having a high electron temperature. That is to say, the plasma generation gas and the raw material gas are actively ionized in the region X. Therefore, if both the nitrogen gas as the plasma generation gas and the monosilane gas as the raw material gas are supplied from the shower plate as in the conventional technique, the nitrogen gas is decomposed into nitrogen ions, nitrogen atomic radicals, and nitrogen atoms in the region X having a high electron temperature. However, since the energy is not sufficient in a region having a low electron temperature, atomic nitrogen having high r activity is hardly generated. Meanwhile, since the monosilane gas is decomposed into $SiH_3$ even at the outside of the region X but a large amount of $SiH_2$ and SiH is generated in the region X having the high electron temperature, $SiH_2$ and SiH are excessively generated in the region X so that a silicon film thus formed is deposited in the gas supply holes of the shower plate.

In order to suppress the generation of deposits by a reaction and a gas phase reaction, the electron temperature in the region X is required to be decreased by lowering the output of the microwave supplied to the antenna 20. However, if the output of the microwave is lowered so as to prevent the excessive generation of $SiH_2$ and SiH, a predetermined electron temperature at which the plasma generation gas is decomposed, is not obtained. Therefore, there is also a limitation in lowering the output of the microwave.

Upon reference to the foregoing, the present inventors made a close study on a method of introducing the raw material gas supplied from the shower plate 100 into the processing vessel 10 without allowing the raw material gas to pass through the region X having a high electron temperature, thus preventing deposits from being deposited in the gas supply holes due to unnecessary reaction production and gas phase reaction. However, if the raw material gas is supplied into the processing vessel 10 through the sidewall of the processing vessel 10 as in the conventional technique, it is difficult to control the flow of gas in the processing vessel 10, and therefore, uniform plasma cannot be obtained.

Thus, the present inventors have noted that, by separately forming the gas flow paths 130 and 140 such that the plasma generation gas and the raw material gas are not nixed inside the shower plate 100, supplying the plasma generation gas into the region X or another region in the vicinity of the region X, and supplying the raw material gas into each place spaced apart from the region X, it is possible to avoid excessive decomposition of the raw material gas, and to efficiently excite the plasma generation gas. Also, the present inventors thought that based on such an idea, for example, the drooping member 101 as shown in FIG. 4 was installed at the lower end of the shower plate 100.

Figure 8:
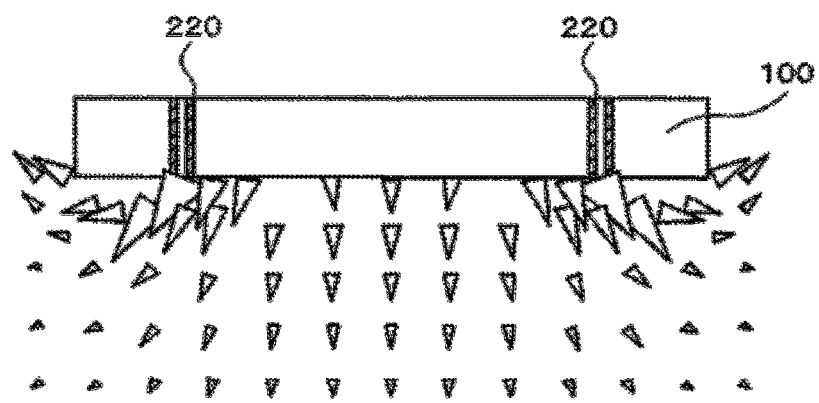
FIG. 8 is an explanation view showing an electric field intensity distribution in the vicinity of the conventional shower plate.
Figure 9:
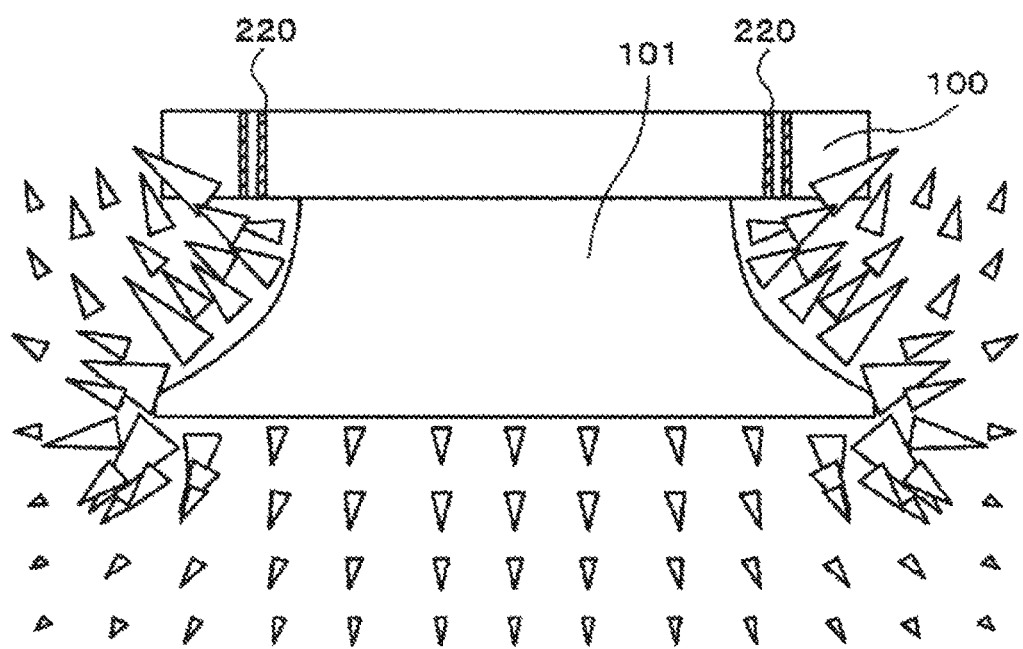
FIG. 9 is an explanation view showing an electric field intensity distribution in the vicinity of a shower plate equipped with a drooping member.

The present inventors first investigated an electric field intensity near the shower plate 100 in installing the drooping member 101 at the lower end of the shower plate 100. FIGS. 8 and 9 show electric field intensity distributions in the vicinity of the shower plate 100 having the slots 220 formed at the outer circumferential portion thereof and electric field directions. While FIG. 8 shows an electric field intensity distribution when only the shower plate 100 is installed, FIG. 9 shows an electric field intensity distribution when the drooping member 101 is installed at the lower end of the shower plate 100. In FIGS. 8 and 9, the size of the triangle represents the intensity of the electric field, and the direction of the triangle represents the direction of the electric field. It was confirmed that the electric field mainly faced downward in the shower plate 100 having the drooping member 101 not installed thereto as shown in FIG. 8, whereas as the drooping member 101 was installed, the electric field intensity in the lateral directions was increased in the vicinity of the outer surface of the drooping member 101 as shown in FIG. 9. From this, it is inferred that the high electron temperature is obtained in the vicinity of the outer surface of the drooping member 101. This is attributed to the fact that since the outer surface of the drooping member 101 spreads outward as it goes from the top end toward the bottom end thereof, a microwave is reflected in a lateral direction or an upwardly inclined direction from the outer surface of the drooping member 101, and therefore, a high-energy state is formed in the vicinity of the outer surface of the drooping member 101.

Figure 10:
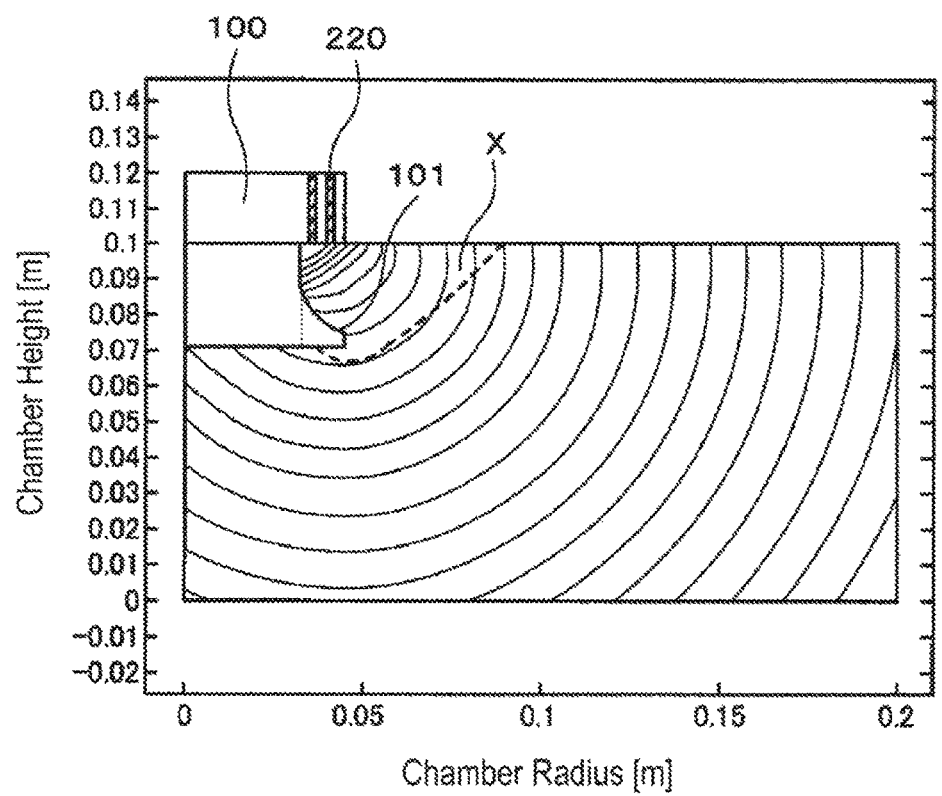
FIG. 10 is an explanation view showing an electron temperature distribution in the vicinity of the shower plate equipped with the drooping member.

Next, FIG. 10 shows an electron temperature distribution in the vicinity of the shower plate 100 when the drooping member 101 is installed to the shower plate 100. In FIG. 10, a distance between the center axis of the coaxial tube 60 and the center of the slot 220 is about 35 mm in the same manner as the case of FIG. 7, and the radius of the bottom surface of the drooping ember 101 is about 45 mm. In FIG. 10, it can be seen that as the drooping member 101 is installed, the region X of which the electron temperature is 1 eV or more is distributed in the vicinity of the slot 220 and in the outer surface of the drooping member 101, and the electron temperature is approximately 1 eV or less under the bottom surface of the drooping member 101. From this, it is inferred that as described above, since the outer surface of the drooping 101 spreads outward as it goes from the top end to the bottom end thereof, a microwave is reflected in a lateral direction or an upwardly inclined direction from the outer surface of the drooping member 101, and therefore, the electric field intensity in the vicinity of the outer surface of the drooping member is increased.

Thus, as shown in FIG. 4, the second gas supply holes 151 are disposed outward of the outer surface of the drooping member 101 and the first gas supply holes 133 and the through-holes 150 and 161 are disposed inward of the outer surface of the drooping member 101. In this state, the plasma generation gas is concentratively supplied into the region X, while the ease-to-decompose raw material gas is introduced into the processing vessel 10 without passing through the region X. This suppresses the raw material gas from being excessively decomposed in the region X, thus suppressing the generation of precursors caused from the raw material gas. Accordingly, it is possible to prevent the through-holes 161 or the second gas supply holes 151 from being clogged.

Figure 11:
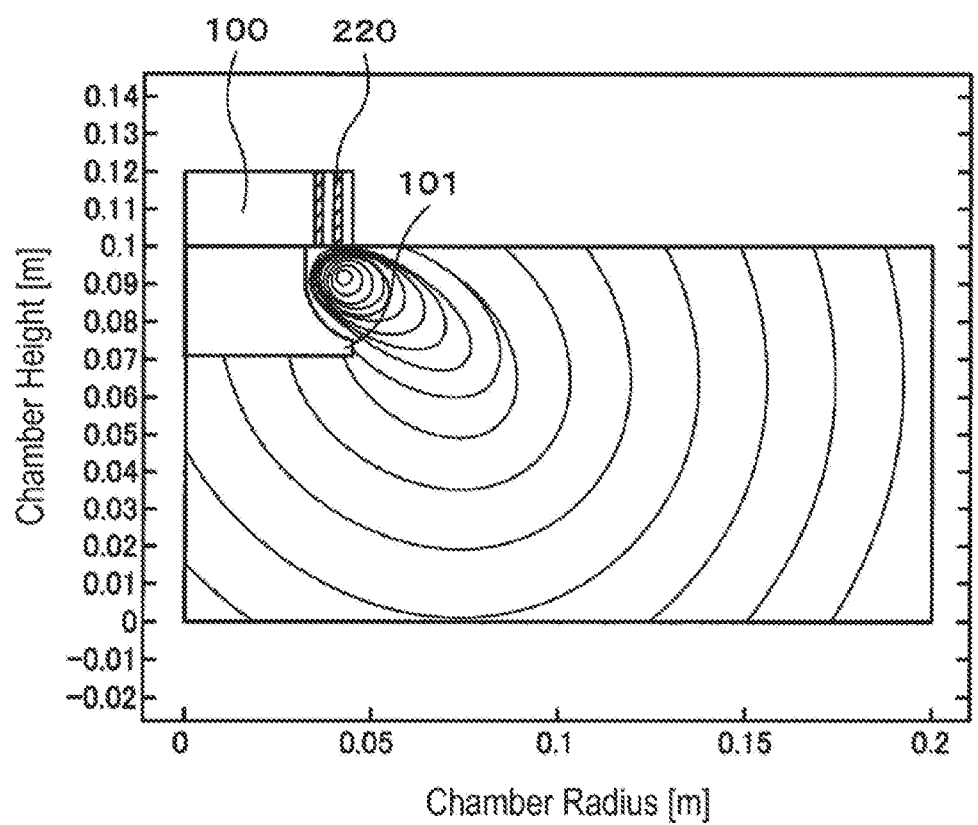
FIG. 11 is an explanation view showing an electron density distribution in the vicinity of the shower plate equipped with the drooping member.

In addition, the present inventors investigated an electron density in the vicinity of the shower plate 100 when the drooping member 101 was installed. As a result, the investigation shows that as shown in FIG. 11, a high-density region is formed in the vicinity of the slot 220 and in the vicinity of the outer surface of the drooping member 101. From this, it can be seen that the region X is in a high-energy state, and the plasma generation gas in the region X is efficiently excited.

Here, as can be seen in FIG. 10, for example, the region X having a high electron temperature is distributed outward from the outer surface of the drooping member 101. For example, when the drooping member is viewed from below, the region X is also distributed at a position outside the bottom surface of the drooping member 101. Therefore, the second gas supply holes 151 are not necessarily formed in the vicinity of the outer surface of the drooping member 101, and may be formed at positions facing the region X. The present inventors have also confirmed that when the outer surface of the drooping member 101 is formed in a parabolic shape in which a contact point (CP) between the shower plate 100 and the outer surface of the drooping member 101 is set as the origin (the vertex of the parabolic shape), for example, as in this embodiment, a region in the vicinity of the focus of the parabolic shape is in a high-energy state. In this case, the second gas supply holes 151 may be formed at positions facing the region in the vicinity of the focus of the parabolic shape.

Here, as can be seen in FIG. 10, for example, the region X having a high electron temperature is distributed outward from the outer surface of the drooping member 101. For example, when the drooping member is viewed from below, the region X is also distributed at a position outside the bottom surface of the drooping member 101. Therefore, the second gas supply holes 151 are not necessarily formed in the vicinity of the outer surface of the drooping member 101, and may be formed at positions facing the region X. The present inventors have also confirmed that when the outer surface of the drooping member 101 is formed in a parabolic shape in which a contact point between the shower plate 100 and the outer surface of the drooping member 101 is set as the origin, for example, as in this embodiment, a region in the vicinity of the focus of the parabolic shape is in a high-energy state. In this case, the second gas supply holes 151 may be formed at positions facing the region in the vicinity of the focus of the parabolic shape.

In addition, the drooping member 101 as a projection is installed to the lower plate 120 and the surface wave propagates through the drooping member 101. This hinders the generation of uniform plasma in the plasma space U. Therefore, the length L of the drooping member 101 may be set to be equal to or smaller than the wavelength of a microwave introduced into the processing vessel 10 at maximum, and in some embodiments, may be set to be equal to or smaller than ½ of the wavelength. The present inventors have found that the length L of the drooping ember 101 is set as described above to suppress the propagation of the surface wave through the drooping member 101, thus stably generating plasma in the processing vessel 10. In this embodiment, since a microwave of 860 MHz with a wavelength of 348.6 mm is used, the length L of the drooping member 101 may be set to fall within a range from about 10 to 60 mm, and in some embodiments, a range from 20 to 40 mm.

Also, the present inventors have found that the electron temperature in the vicinity of the bottom surface of the drooping member 101 is higher than 1 eV by the surface wave plasma under the bottom surface of the drooping member 101. In this case, if the orifice portion 162 is formed at the lower end surface of the drooping member 101. $SiH_2$ or Si is generated as electrons collide with the monosilane gas in the vicinity of the orifice portion 162, or SiN is generated as radicals of the plasma generation gas, such as nitrogen gas, collide with the monosilane gas. This generates a reactive product. As a result, the reactive product is formed and deposited at the orifice portion 162 so that the orifice portion 162 is clogged.

Under these circumstances, in this embodiment, for example, as shown in FIG. 6, the upwardly-depressed concave portion 160 is formed in the lower end surface of the drooping member 101, and the orifice portion 162 is installed above the concave portion 160. In other words, a predetermined distance is ensured between the orifice portion 162 and the lower end surface of the drooping member 101. In addition, since the potential of the drooping member 101 is the ground potential, the surface wave is prevented from being introduced into the concave portion 160, so that it is possible to suppress the electron temperature in the vicinity of the orifice portion 162 or suppress the arrival of electrons or radicals in the vicinity of the orifice portion 162. As a result, it is possible to prevent a reactive product from being formed and deposited at the orifice portion 162, and to prevent the orifice portion 162, i.e., the first gas supply hole 133, from being clogged.

In addition, the present inventors have performed an experiment to check, in determining the size of the concave portion 160, a change in electron temperature in the vicinity of an upper end of the concave portion 160 (in the vicinity of a lower end of the orifice 162) while changing the height of the concave portion 160 in a range from 3 to 10 mm and the radius of the concave portion 160 in a range from 1 to 3 mm. At that time, the length L of the drooping member 101 was set to about 16 mm. As a result, when the radius of the concave portion 160 was set to about 1 mm and the height of the concave portion 160 was set to about 3 to 7 mm, the electron temperature at the upper end thereof was about 0.9 eV to 0.95 eV. In addition, when the radius of the concave portion 160 was set to about 2 mm and the height of the concave portion 160 was set to about 5 to 10 mm, the electron temperature at the upper end of the concave portion 160 was about 0.71 to 0.81 eV. Furthermore, when the radius of the concave portion 160 was set to about 3 mm and the height of the concave portion 160 was set to about 5 mm, the electron temperature at the upper end of the concave portion 160 was about 1.0 eV. Therefore, from the experimental results, the radius of the concave portion 160 may be set to fall within a range from 1 to 3 mm, and in some embodiments, about 2 mm. Also, the height of the concave portion 160 may be set to fall within a range from about 3 to 10 mm, and in some embodiments, a range from about 5 to 7 mm. The plasma processing apparatus 1 according to this embodiment is based on the above-described findings.

As shown in FIG. 1, the control part 500 is installed in the plasma processing apparatus 1. The control part 500 is, for example, a computer, and includes a program storage part (not shown). The program storage part stores a program for controlling the process of the wafer W in the plasma processing apparatus 1. Also, the program may be stored, for example, in a computer-readable storage medium such as a computer-readable hard disc (HD), a flexible disc (FD), a compact disc (CD), a magneto-optical disc (MO), a memory card or the like, and may be installed from the storage medium into the control part 500.

The plasma processing apparatus 1 according to this embodiment is configured as described above. Next, a case where a silicon nitride film is formed on the wafer W in the process performed using the plasma processing apparatus 1 will be described as an example.

First, the wafer W is loaded into the processing vessel 10 and mounted on the susceptor 11. Then, a gas mixture of a nitrogen gas, an argon gas and a hydrogen gas is introduced as the plasma generation gas into the processing vessel 10 through the lower plate 120 of the shower plate 100 from the second gas supply source 141. Thereafter, a microwave is output from the microwave output part 40 and introduced into the processing vessel 10 through the microwave transmitting mechanism 30, the slow-wave plate 70, and the slots 220. Accordingly, a surface wave plasma is generated by a metal surface wave formed on surfaces of the antenna 20 and the drooping member 101. At this time, since the region X n the vicinity of the outer surface of the drooping member 101 having the slots 220 formed therein is in a high-energy state, the plasma generation gas supplied from the second gas supply holes 151 is excited by the high energy in the region X, so that nitrogen radicals are efficiently generated. In addition, a monosilane gas is introduced as a raw material gas into the processing vessel 10 from the first gas supply source 131 through the first gas supply holes 133, and the through-holes 150 and 161.

The monosilane gas introduced into the processing vessel 10 is excited by plasma and decomposed into $SiH_3$. At this time, since the monosilane gas is introduced into the plasma space U of the processing vessel 10 from the bottom surface of the drooping member 101, the monosilane gas does not pass through the region X having the high electron temperature. This suppresses the reaction production and the gas phase reaction from being occurred due to excessive $SiH_3$. Also, since the electron temperature in the vicinity of the orifice portion 162 is suppressed by the concave portion 160, it is possible to suppress the generation of a reactive product in the vicinity of the orifice portion 162.

In addition, the nitrogen radicals and $SiH_3$ reach an upper surface of the wafer W along a vertically-downward gas stream toward the wafer W from the shower plate 100 and are deposited as silicon nitride on the surface of the wafer W. Thus, a silicon nitride film is formed on the upper surface of the wafer W.

According to the above embodiments, since the first gas supply holes 133 are formed inward of the outer surface of the drooping member 101, the first gas does not pass through the region X, in which the electron temperature is high, in the vicinity of the slots 220 formed in the shower plate 100. Thus, it is possible to prevent the monosilane gas from being excessively decomposed by the s face wave plasma. As a result, when a plasma process is performed on the water W using the shower plate 100, it is possible to prevent deposits caused from the reaction production and the gas phase reaction, i.e., the silicon film in this embodiment, from being formed in gas holes such as the through-holes 161 or the second gas supply holes 151 of the shower plate 100.

In addition, since the upwardly-depressed concave portion 160 is formed in the lower end surface of the drooping member 101 and the through-holes 161 having the orifice portions 162 are formed above the concave portion 160, a predetermined distance can be ensured between the orifice portion 162 and the lower end surface of the drooping member 101. Since the potential of the drooping member 101 is the ground potential, the surface wave is prevented from being introduced into the concave portion 160. Accordingly, it is possible to suppress the electron temperature in the vicinity of the orifice portion 162 or suppress the arrival of electrons or radicals in the vicinity of the orifice portion 162. As a result, it is possible to prevent a reactive product from being formed and deposited at the orifice portion 162, and thus, to prevent the orifice portion 162, i.e., the first gas supply hole 133, from being clogged.

In addition, since the outer surface of the drooping member 101 has a parabolic shape, and the shape of the drooping member 101 and the arrangement of the slots 220 are set so that imaginary lines drawn vertically downward from the centers of the slots 220 respectively intersect the parabolic shape, the microwave is reflected in a lateral direction or an upwardly inclined direction from the outer surface of the drooping portion 101. Accordingly, the electric field intensity in the vicinity of the outer surface of the drooping member 101 is increased, so that the region X in the high-energy state is formed in the vicinity of the outer surface of the drooping member 101. As a result, the second gas supplied from the second gas supply holes 151 is efficiently excited, so that plasma can be efficiently generated. Also, the positional relationship between the slots 220 and the drooping member 101 is not necessarily limited to this embodiment. Although the slots 220 are positioned outside the parabolic shape of the outer surface of the drooping member 101, since the microwave introduced from the slots 220 is reflected by the outer surface of the drooping member 101, a region having a high electric field intensity can be formed in the vicinity of the outer surface of the drooping member 101.

According to this embodiment, the drooping member 101 is installed at the bottom surface of the shower plate 100, so that for example as shown in FIG. 9, the electric field intensity in the lateral direction is increased in the vicinity of the outer surface of the drooping member 101. Here, in the conventional shower plate having the drooping member 101 not installed thereto, for example, as shown in FIG. 8, the expansion of the electric field in the lateral direction from the shower plate was not large, and the electric field intensity of a region corresponding to the lower position of the coaxial tube 60 tended to be relatively higher than those of the other regions. As a result, the electric field intensity in the processing vessel became non-uniform, and therefore, there was a limitation in performing a uniform plasma process. In this respect, as the drooping member 101 is installed according to this embodiment, the electric field intensity can be increased, thereby uniformizing the electric field intensity distribution as compared with the conventional technique. Thus, according to the plasma processing apparatus 1 of this embodiment, it is possible to perform a plasma process having a higher uniformity than the conventional technique.

Since a temperature in the vicinity of the bottom surface of the lower plate 120 is high by the surface wave plasma, a temperature of the gas flowing through the gas flow paths is also increased by heat of the plasma. As a result, the internal energy of the gas in the gas flow paths 140 increases and therefore the gas is changed to an easy-to-decompose gas. Thus, if a hard-to-decompose gas, i.e., the plasma generation gas in this embodiment, flows through the gas flow paths 140, the decomposition of the gas by the surface wave plasma can be accelerated. Therefore, the second gas supply source 141 configured to supply the plasma generation gas is preferably connected to the gas flow paths 140 of the lower plate 120.

Figure 12:
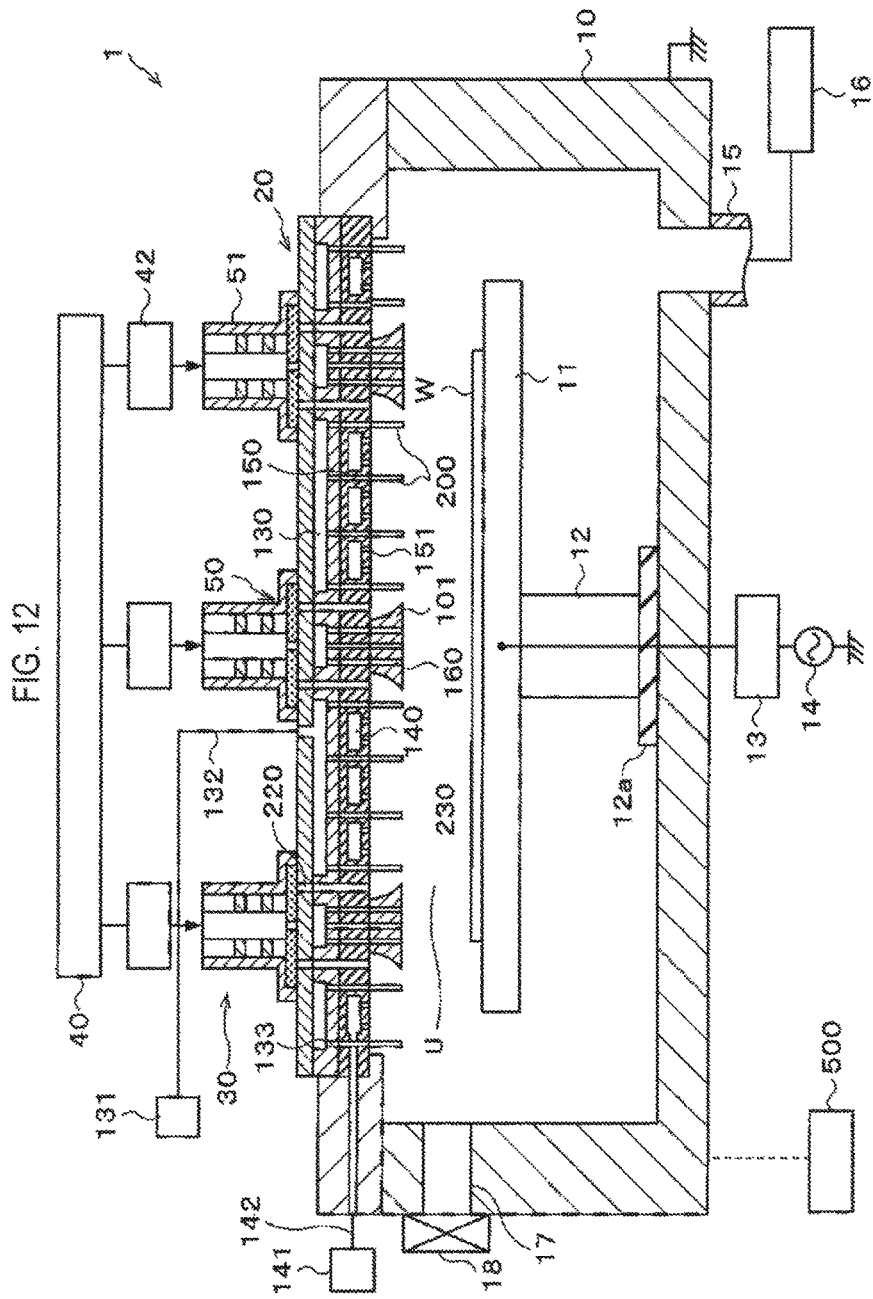
FIG. 12 is a longitudinal sectional view schematically showing a configuration of a plasma processing apparatus according to another embodiment of the present disclosure.

While in the above embodiments, the first gas supply holes 133 has been described to be formed at only positions corresponding to the drooping member 101, the first gas supply holes 133 may be formed at other positions in the drooping member 101. In some embodiments, as shown in FIG. 12, the second gas supply holes 151 and the first gas supply holes 133 may be disposed at approximately regular intervals in the bottom surface of the shower plate 100. Also, the through-holes 150 are formed at positions corresponding to the first gas supply holes 133 of the lower plate 120. In this case, when the first gas used as the raw material gas passes through a region having a high electron temperature in the vicinity of the bottom surface of the lower plate 120, supply nozzles 200 having a predetermined length may be respectively provided at lower ends of the through-holes 150 such that a deposit caused from the reaction production and the gas phase reaction is prevented from clogging the gas holes such as the second gas supply holes 151 or the through-holes 150. Although in FIG. 12, the length of each of the supply nozzles 200 has been shown to be equal to the length L of the drooping member 101, the present disclosure is not limited thereto. In some embodiments, the length of each of the supply nozzles 200 may be arbitrarily set as long as the supply nozzles 200 pass through a region having a relatively high electron temperature, e.g., a region spaced apart by about 5 mm or less from the bottom surface of the shower plate 100 as described above. As the supply nozzles 200 used as projections are provided, the surface wave also propagates through the supply nozzles 200 to generate resonance. This may hinder the generation of uniform plasma in the plasma space U. Thus, in some embodiments, the length of the supply nozzle 200 may be set to about $\frac{1}{16}$ to $\frac{3}{16}$ of the wavelength of the microwave introduced into the processing vessel 10, and especially, about $\frac{1}{8}$.

Figure 13:
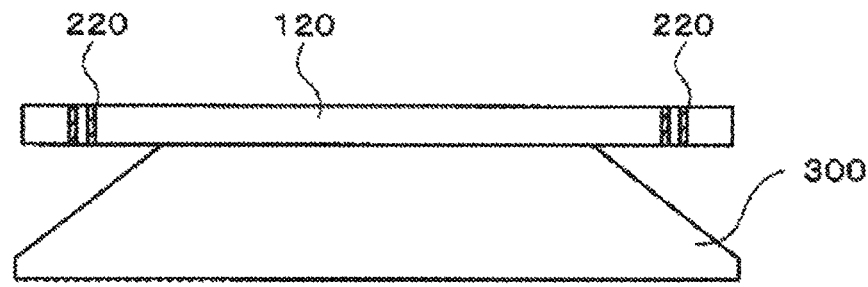
FIG. 13 is a side view schematically showing a configuration of a drooping member according to another embodiment of the present disclosure.
Figure 14:
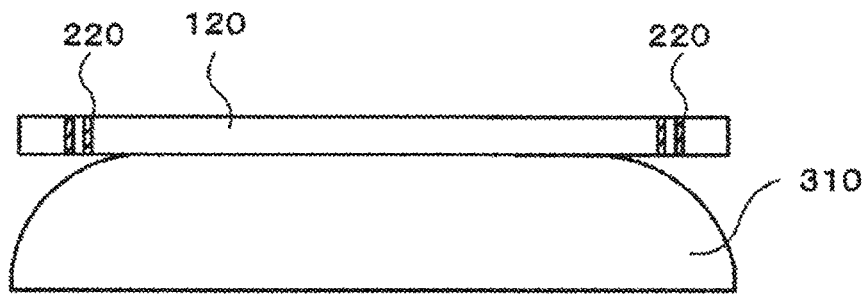
FIG. 14 is a side view schematically showing a configuration of a drooping member according to another embodiment of the present disclosure.

While in the above embodiments, the outer surface of the drooping member 101 has been described to have the parabolic shape, the present disclosure is not limited thereto. In some embodiments, the outer surface of the drooping member 101 may be arbitrarily set as long as it spreads outward as it goes from the top end to the bottom end thereof. As an example, as shown in FIG. 13, a drooping member 300 having an approximately truncated cone shape, of which the outer surface is formed in a line shape, may be used. Alternatively, as shown in FIG. 14, a drooping member 310 having an approximately secondary curved shape in which a tangential direction of an outer surface thereof is gradually changed from an inclined direction to a vertical direction, may be used. According to the present disclosure, if the outer surface of the drooping member 101 has a shape spreading outward as it goes from the top end to the bottom end thereof, since the microwave is reflected in a lateral direction or an upwardly inclined direction from the outer surface of the drooping member 101, a high-energy state may be formed in the vicinity of the outer surface of the drooping member 101.

Figure 15:
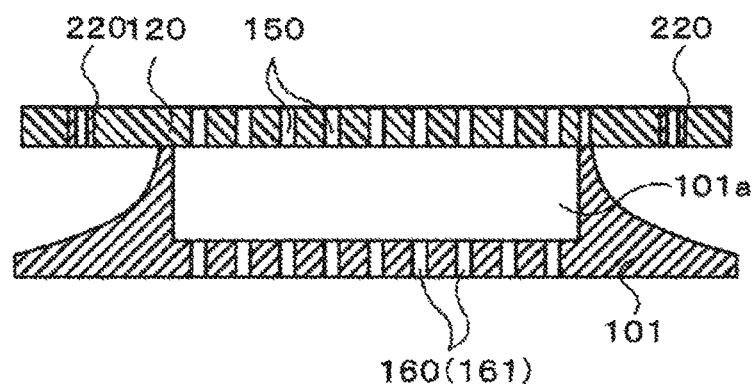
FIG. 15 is a longitudinal sectional view schematically showing a configuration of a drooping member according to another embodiment of the present disclosure.

Although in the above embodiments, the through-holes 161 vertically penetrating through the drooping member 101 has been described to be formed inside the drooping member 101, the through-holes 161 may extend in, e.g., an inclined direction. Further, in some embodiments, the shape of each of the through-holes 161 may be arbitrarily set as long as they are formed at a position not facing the region X such that, for example, a raw material gas such as a monosilane gas is not excessively decomposed. Further, in some embodiments, as shown in FIG. 15, a gas chamber 101a in communication with the through-holes 150 of the lower plate 120 may be formed inside the drooping member 101, and through-holes 161 may be formed below the gas chamber 101a. In FIG. 15, the orifice portions 162 are not shown.

While in the above embodiments, the gas flow path 130 of the upper plate 110 and the gas flow path 140 of the lower plate 120 are coupled to the first gas supply source 131 and the second gas supply source 141 through the single supply pipe 132 and the single supply pipe 142, respectively, the present disclosure is not limited thereto. In some embodiments, for example, the gas flow path 130 and the gas flow path 140 may be configured as ring-shaped concentric circular flow paths independent of each other, respectively. Further, in some embodiments, a plurality of supply pipes 132 and a plurality of supply pipes 142 may be installed to the respective gas flow paths 130 and 140, so that a flow rate of the gas supplied to the respective flow path is controlled. By doing so, the supply amount of gas can be controlled in every region of the lower plate 120. For example, the supply amount of the raw material gas or the plasma generation gas can be controlled corresponding to an electric field intensity distribution, thereby performing a more uniform plasma process on the wafer W.

Particularly, when a monosilane gas used as the raw material gas is supplied into the processing vessel 10 using the shower plate 100 having the drooping member 101 not installed thereto as in the conventional technique, the raw material gas is excessively decomposed in the vicinity of the bottom surface of the shower plate 100, and hence it is difficult to control the amount of produced $SiH_3$. However, in the present disclosure, the monosilane gas is supplied through the drooping member 101, so that $SiH_3$ can be prevented from being excessively produced. Thus, the amount of produced $SiH_3$ can be easily adjusted by controlling the supply amount of the monosilane gas. Accordingly, it is possible to control a thickness of a film formed on the wafer W. In this case, the supply amount of gas is controlled in every region of the lower plate by installing the plurality of supply pipes 132 and the plurality of supply pipes 142, so that the amount of produced nitrogen radicals and $SiH_3$ can be strictly adjusted in each region. This enables a more uniform plasma process on the wafer W.

Figure 16:
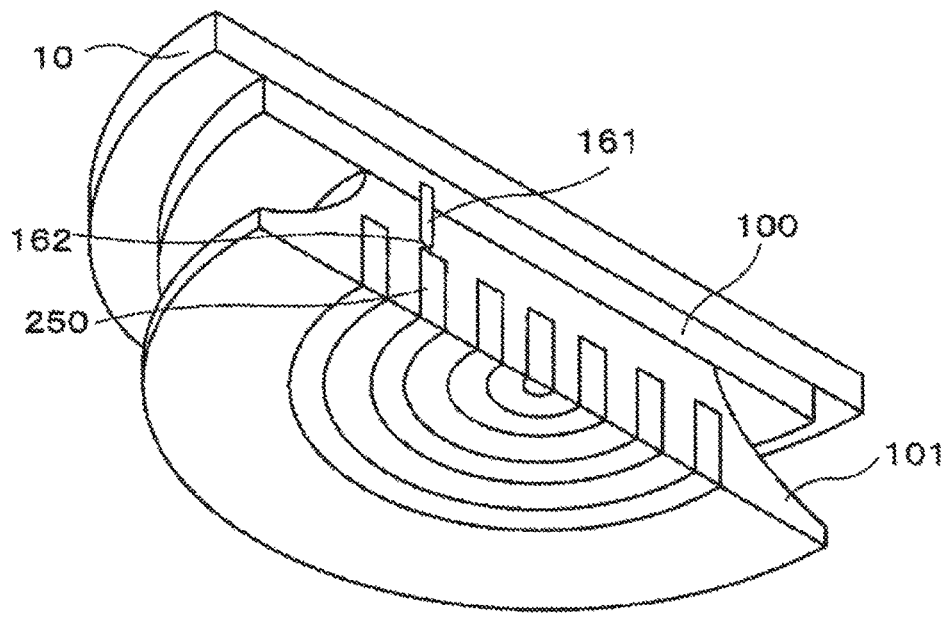
FIG. 16 is a perspective view showing a sectional shape in the vicinity of a drooping member according to another embodiment of the present disclosure.

While in the above embodiments, the concave portion 160 has been described to have the circular cylindrical shape, the shape of the concave portion 160 may be arbitrarily set as long as it is depressed upwardly from the bottom surface of the drooping member 101. In some embodiments, as shown in FIG. 16, a concave portion 250 having a ring slit shape may be used. Even in this embodiment, it is confirmed that, by properly setting a width and height of the concave portion 250, a reactive product can be prevented from being formed and deposited at the orifice portion 162.

Figure 17:
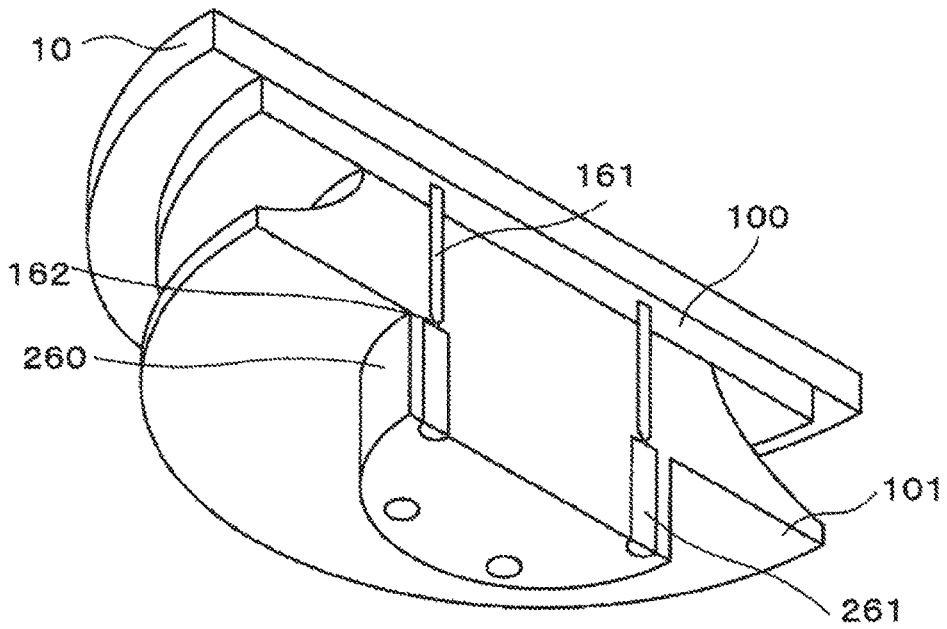
FIG. 17 is a perspective view showing a sectional shape in the vicinity of a drooping member according to another embodiment of the present disclosure.

Alternatively, as shown in FIG. 17, an additional dropping member 260 extending further downward may be installed in the lower end surface of the drooping member 101, and upwardly-depressed concave portions 261 may be further formed in a lower end surface of the additional drooping member 260.

According to some embodiments of the present disclosure, a plasma processing apparatus which includes a shower plate configured to introduce a gas into a processing vessel and generates a surface wave plasma using a microwave can suppress a product caused by a reaction production and gas phase reaction from being deposited in gas holes of the shower plate, and efficiently generate plasma.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A plasma processing apparatus that processes a substrate by generating plasma using a surface wave formed on a surface of a shower plate a supplied microwave, the plasma processing apparatus including a plasma generating antenna which is equipped with the shower plate configured to supply a first gas and a second gas into a processing vessel, which comprises:

a protrusion member made of a conductor and installed to protrude downward from a lower end surface of the shower plate, the protrusion member having a truncated conical shape, wherein an outer surface of the protrusion member spreads outward as it goes from a top end to a bottom end thereof, wherein the shower plate includes a plurality of first gas supply holes through which the first gas is supplied into a plasma space of the processing vessel and a plurality of second gas supply holes through which the second gas is supplied into the plasma space of the processing vessel, wherein an upwardly-depressed concave portion is formed in a lower end surface of the protrusion member, wherein through-holes are in communication with the concave portion from an upper end surface of the protrusion member and are formed inside the protrusion member, wherein each of the first gas supply holes is disposed inward of the outer surface of the protrusion member and is connected to at least one of the through-holes, wherein each of the second gas supply holes is disposed outward of the outer surface of the protrusion member as viewed from above, wherein an orifice portion having a smaller sectional area than one of the through-holes is formed in one of the through-holes, wherein a potential of the protrusion member is a ground potential, wherein a microwave radiation hole through which the supplied microwave is radiated into the plasma space of the processing vessel is formed in the shower plate, and wherein the microwave radiation hole is disposed inward of an outer circumferential end portion of the protrusion member as viewed from above, and is opened to a region of the plasma space, the region being interposed between the lower end surface of the shower plate and the outer surface of the protrusion member, to introduce the supplied microwave into the region.

2. The plasma processing apparatus of claim 1, wherein a slope of a vertical cross section of the protrusion member is formed in a parabolic shape in which a contact point of the shower plate and the slope of the vertical cross section of the protrusion member is set as a vertex of the parabolic shape.

3. The plasma processing apparatus of claim 1, wherein a minimum energy required to decompose the first gas is less than a minimum energy required to excite the second gas.

4. The plasma processing apparatus of claim 3, wherein the first gas is a raw material gas, and the second gas is a plasma generation gas.

5. The plasma processing apparatus of claim 1, wherein the microwave radiation hole is arranged such that an imaginary line drawn vertically downward from a center of the microwave radiation hole intersects the outer surface of the protrusion member.

* * * * *

UNITED STATES PATENT AND TRADEMARK OFFICE
CERTIFICATE OF CORRECTION

PATENT NO.       : 10,443,130 B2
APPLICATION NO.  : 14/968346
DATED            : October 15, 2019
INVENTOR(S)      : Taro Ikeda It is certified that error appears in the above-identified patent and that said Letters Patent is hereby corrected as shown below:

In the Claims

Claim 1, Column 17, Line 3, please delete the phrase "a surface of a shower plate a supplied" and replace with "a surface of a shower plate by a supplied".

Signed and Sealed this
Thirty-first Day of December, 2019

Andrei Iancu
*Director of the United States Patent and Trademark Office*